(12) United States Patent
Scheifers et al.

(10) Patent No.: US 6,677,607 B2
(45) Date of Patent: Jan. 13, 2004

(54) ORGANIC SEMICONDUCTOR DEVICE HAVING AN OXIDE LAYER

(75) Inventors: Steven M. Scheifers, Hoffman Estates, IL (US); Daniel R. Gamota, Palatine, IL (US); Paul W. Brazis, Jr., South Elgin, IL (US); Jie Zhang, Buffalo Grove, IL (US); Lawrence E. Lach, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 27 days.

(21) Appl. No.: 10/057,367

(22) Filed: Jan. 25, 2002

(65) Prior Publication Data

US 2003/0141524 A1 Jul. 31, 2003

(51) Int. Cl.[7] .............................................. H01L 35/24
(52) U.S. Cl. ........................ 257/40; 257/288; 438/149; 438/151
(58) Field of Search .................. 257/288, 40; 438/149, 438/151

(56) References Cited

U.S. PATENT DOCUMENTS

| | | | |
|---|---|---|---|
| 6,329,226 B1 | * | 12/2001 | Jones et al. .................. 438/151 |
| 6,433,359 B1 | * | 8/2002 | Kelley et al. .................. 257/40 |
| 2003/0160234 A1 | * | 8/2003 | Ong et al. .................... 257/40 |

* cited by examiner

*Primary Examiner*—Richard Elms
*Assistant Examiner*—Brad Smith
(74) *Attorney, Agent, or Firm*—Daniel K. Nichols

(57) ABSTRACT

A semiconductor device having a flexible or rigid substrate (11) having a gate electrode (21), a source electrode (61 and 101), and a drain electrode (62 and 102) formed thereon and organic semiconductor material (51, 81, and 91) disposed at least partially thereover. The gate electrode (21) has a thin dielectric layer 41 formed thereabout through oxidation. In many of the embodiments, any of the above elements can be formed through contact or non-contact printing. Sizing of the resultant device can be readily scaled to suit various needs.

25 Claims, 1 Drawing Sheet

ORGANIC SEMICONDUCTOR DEVICE HAVING AN OXIDE LAYER

This invention was made with United States Government support under Agreement No. 70NANBOH3033 awarded by the National Institute of Standards and Technology (NIST). The United States Government has certain rights in the invention.

TECHNICAL FIELD

This invention relates generally to semiconductors and more particularly to organic semiconductor materials.

BACKGROUND

Components (such as metal oxide semiconductor field effect transistors (MOSFETs)) and circuits comprised of semiconductor materials are known in the art. Such technology has been highly successful. For some applications, however, traditional semiconductor processing overperforms and represents unneeded form factors and capabilities at a commensurate additional cost. In addition, traditional semiconductor processing often yields small parts that present handling difficulties during assembly and further require careful packaging. Traditional semiconductor processing also usually requires batch processing to achieve a reasonable cost per part because the fabrication facilities and equipment required are extremely expensive. Also, many semiconductor devices require a lengthy fabrication time and often require numerous chemicals, some of which are highly toxic and require special handling. These aspects of traditional semiconductor fabrication do not well support low data storage and data transmission rate applications and/or less expensive needs.

BRIEF DESCRIPTION OF THE DRAWINGS

The above needs are at least partially met through provision of the organic semiconductor device and method described in the following detailed description, particularly when studied in conjunction with the drawings, wherein.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

Generally speaking, pursuant to these various embodiments, a gate is formed on a substrate and an oxide layer formed on the gate, which oxide layer serves as a dielectric. Organic semiconductor material is at least partially disposed over the gate. Typically a source electrode and drain electrode will also be provided (on or overlying the substrate) in contact with the organic semiconductor material. So configured, a MOSFET will result. The substrate can be flexible or rigid. Furthermore, any of the various elements described above can be formed through printing processes (including both contact and non-contact printing processes). As a result, extremely inexpensive devices can be made without a need for batch processing, large and complicated fabrication facilities, or many of the dangerous chemicals often associated with semiconductor processing. Also, no additional materials or steps are required to deposit an insulating material around the gate as the oxide layer serves this purpose.

Figure 1:
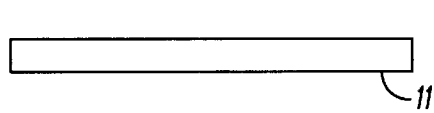
FIGS. 1–5 illustrate a first set of various embodiments.

Referring now to FIG. 1, a first embodiment will be described. An initial substrate 11 can be comprised of a variety of materials, including flexible and substantially rigid materials. In general, the substrate 11 itself should be an insulator. Various plastics, including thin flexible sheets such as polyester, generally work well for these purposes. Depending upon the application, however, other materials can work as well, including cloth and paper (though some treatment may be appropriate to ensure better adhesion of the deposited materials). The substrate 11 can be of various sizes as commensurate with the desired size of the final result.

Figure 2:
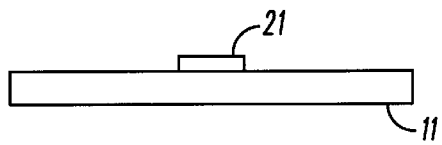
Figure 3:
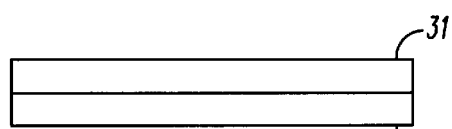

Referring to FIG. 2, a gate electrode 21 is formed on the substrate 11. The gate electrode 21 comprises a conductor formed of a material such as copper, aluminum, titanium, tantalum, calcium, zirconium, chromium, or nickel. This gate electrode 21 can be formed by printing the conductive material onto the substrate 11. (Another approach would be to provide a substrate 11 having a conductive layer 31 or foil disposed thereon as shown in FIG. 3 and to use ordinary photoimaging and printing/etching processes to remove some of the conductive layer 31 to thereby leave the gate electrode 21 as shown in FIG. 2.) In general, the materials noted above will oxidize. If desired, the base gate electrode 21 can be formed of a material that is less likely to oxidize. If such material is selected, then a thin layer of material that will oxidize can then be deposited over the surface of the gate electrode 21.

Figure 4:
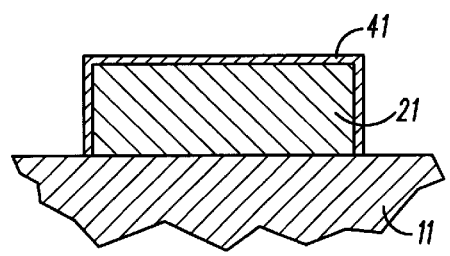

At least portions of the gate electrode 21 are then exposed to an oxidizing environment. This can be done in various ways, including by exposing the gate electrode 21 to an oxidizing solution (such as, for example, hydrogen peroxide), hot water vapor, steam, and/or ultraviolet exposure. The duration of exposure need not be especially lengthy, as an oxide layer 41 (see FIG. 4) of only 100 to 10,000 Ångstroms needs to be formed (thicker layers can of course be created as may be appropriate to a particular intended application or set of design requirements). This oxide layer 41 comprises a thin dielectric layer that will insulate the gate electrode 21 from the semiconductor material described below.

Figure 5:
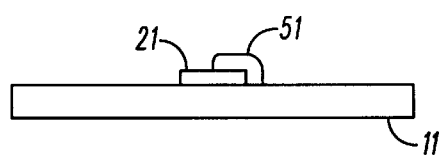

Referring now to FIG. 5, organic semiconductor material 51 is then applied to contact at least portions of the gate electrode 21 (in general, additional electrodes will be included as well as described below, and the semiconductor material 51 can also completely cover the gate electrode 21). The organic semiconductor material 51 can be applied, if desired, by any of a variety of printing techniques including both contact and non-contact printing techniques.

Figure 6:
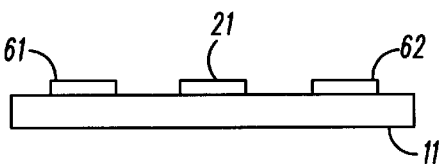
FIGS. 6–8 illustrate a second set of various embodiments.
Figure 7:
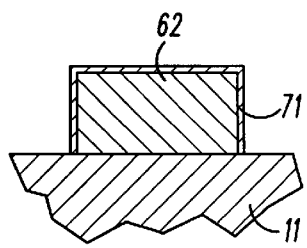
Figure 8:
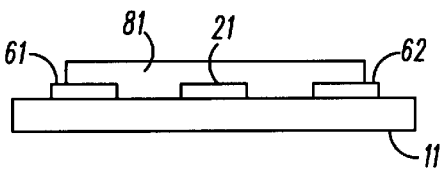

Referring to FIG. 6, a source electrode 61 and drain electrode 62 can also be formed on the substrate 11. The source electrode 61 and drain electrode 62 are formed of a material, such as copper, aluminum, titanium, chromium, gold, indium tin oxide, nickel, palladium, platinum, polyaniline, polyethylene dioxythiophene, silver, titanium nitride, tungsten, or aluminum doped zinc oxide. These electrodes 61 and 62 can be formed either by depositing the materials on the substrate 11 (again through printing processes as desired) or by forming them from an initial conductive layer 31 as described above with respect to FIG. 3. When the source electrode 61 and drain electrode 62 are comprised of a material that is prone to oxidation, a layer of substantially oxidation resistant material 71 (such as, for example, an organic coating or a sufficiently oxidation resistant metal such as chrome, gold, or platinum) can be disposed thereon as shown in FIG. 7. In general, the electrodes 61 and 62 should be substantially oxide free to prevent a dielectric layer from forming or in any event should be predisposed to form an electrically conductive contact with the organic semiconductor material 81. Referring now to FIG. 8, organic semiconductor material 81 is then disposed at least partially over the gate electrode 21, source electrode 61, and drain electrode 62. So configured, with the thin dielectric layer formed over the gate electrode 21 as before, a device comprising a metal oxide semiconductor field effect transistor results.

As noted above, any of the above elements (the electrodes 21, 61, and 62 and the organic semiconductor material 51 and 81) can be formed by use of one or more printing processes. For example, contact printing processes (including but not limited to stamping, screen printing, flexographic, and micro-contact printing) and non-contact printing processes (including but not limited to ink jet, electrostatic, laser transfer, and micro-dispensing) can be used to print the indicated materials as described. Depending upon the material form and carrier used, air drying and/or curing steps may be appropriate to ensure the desired adhesion and mechanical integrity.

A typical device will have an overall thickness of only a few microns (depending upon the specific materials, deposition process, and number of layers) and can have a footprint ranging from a few square microns to one thousand or more square microns. Notwithstanding such sizes, when formed upon a flexible substrate, the resultant device can maintain normal functionality even when flexed during use (of course, extreme bending of the substrate may, at some point, disrupt the continuity of one of more of the constituent elements of the device).

Figure 9:
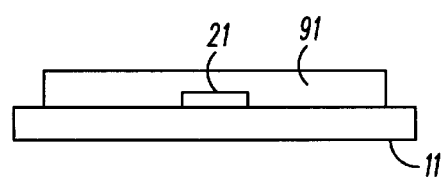
FIGS. 9 and 10 a third set of various embodiments.
Figure 10:
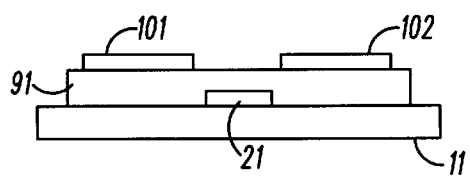

The embodiments described above present the various elements as being stacked in a particular order. That is, the semiconductor material overlies the various electrodes which overly the substrate. Other orientations, however, are possible and acceptable. For example, with reference to FIG. 9, the organic semiconductor material 91 can overlie the gate electrode 21 as before (where, again, a thin dielectric layer formed through oxidation surrounds the gate electrode 21). The source electrode 101 and drain electrode 102 can then be disposed on top of the organic semiconductor material 91 as depicted in FIG. 10. Notwithstanding this alternative orientation, again a MOSFET device will result.

A wide variety of materials can be used consistently with the above processes and embodiments. Furthermore, a wide range of processing parameters can be varied, including device size and constituent element sizes, to suit a wide variety of application requirements. Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A device comprising:
   a substrate;
   at least one electrode comprising a gate disposed on the substrate;
   a dielectric layer comprising an oxide layer formed on an exterior surface of the at least one electrode;
   at least one additional electrode;
   an organic semiconductor layer disposed over at least a portion of the dielectric layer and the at least one additional electrode, wherein at least one of the conductor, dielectric layer, and organic semiconductor is printed.

2. The device of claim 1 wherein the substrate comprises a flexible substrate.

3. The device of claim 1 wherein the substrate comprises a rigid substrate.

4. The device of claim 1 wherein the at least one electrode comprises a gate.

5. The device of claim 1 wherein the oxide layer is no greater than 10 microns in thickness.

6. The device of claim 1 wherein the oxide layer is between 100 and 10,000 Angstroms in thickness.

7. The device of claim 1 wherein the dielectric layer has no openings disposed therethrough.

8. The device of claim 1 wherein the at least one electrode is comprised of a metal.

9. The device of claim 8 wherein the dielectric layer comprises an oxide of the metal.

10. The device of claim 8 wherein the metal is comprised of at least one of copper, aluminum, titanium, tantalum, calcium, zirconium, chromium, and nickel.

11. The device of claim 10 wherein the dielectric layer comprises an oxide of the metal.

12. The device of claim 1 wherein the at least one electrode comprises electrode means for providing an electrode for an active device.

13. The device of claim 12 wherein the active device comprises a metal oxide semiconductor field effect transistor.

14. A metal oxide semiconductor field effect transistor comprising:
   a substrate;
   an electrode comprising a gate printed on the substrate;
   a dielectric comprising an oxide formed on the electrode;
   at least one additional electrode;
   an organic semiconductor material disposed over the dielectric and at least partially over the at least one additional electrode.

15. The metal oxide semiconductor field effect transistor of claim 14 wherein the at least one additional electrode comprises a second and third electrode comprising a drain and source disposed in contact with the organic semiconductor material.

16. The metal oxide semiconductor field effect transistor of claim 15 wherein the second and third electrodes are printed on the substrate.

17. The metal oxide semiconductor field effect transistor of claim 15 wherein the second and third electrodes are substantially oxide free.

18. The metal oxide semiconductor field effect transistor of claim 15 wherein the second electrode and the third electrode are each comprised of substantially the same material.

19. The metal oxide semiconductor field effect transistor of claim 18 wherein the material comprises one of copper, aluminum, titanium, chromium, gold, indium tin oxide, nickel, palladium, platinum, polyaniline, polyethylene dioxythiophene, silver, titanium nitride, tungsten, and aluminum doped zinc oxide.

20. The metal oxide semiconductor field effect transistor of claim 15 wherein the second and third electrodes have an oxidation resistant material disposed thereon.

21. The metal oxide semiconductor field effect transistor of claim 20 wherein the oxidation resistant material comprises one of an organic coating and an oxidation resistant metal.

22. The metal oxide semiconductor field effect transistor of claim 21 wherein the oxidation resistant metal comprises at least one of chrome, gold, and platinum.

23. The metal oxide semiconductor field effect transistor of claim 15 wherein the second and third electrodes are comprised of oxidation resistant metal.

24. The metal oxide semiconductor field effect transistor of claim 15 wherein the substrate comprises a flexible substrate.

25. The metal oxide semiconductor field effect transistor of claim 14 wherein the substrate comprises a substantially rigid substrate.

* * * * *